US011533112B2

(12) United States Patent
Liu et al.

(10) Patent No.: US 11,533,112 B2
(45) Date of Patent: Dec. 20, 2022

(54) BEAM SYNTHESIS METHOD AND APPARATUS FOR MEASURING ARRAY ANTENNA (71) Applicant: KUANG-CHI INSTITUTE OF ADVANCED TECHNOLOGY, Nanshan District Shenzhen (CN)

(72) Inventors: RuoPeng Liu, Nanshan District Shenzhen (CN); Zhiya Zhao, Nanshan District Shenzhen (CN); Hua Tian, Nanshan District Shenzhen (CN); Yang He, Nanshan District Shenzhen (CN)

(73) Assignee: Kuang-Chi Institute of Advanced Technology, Guangdong (CN)

( * ) Notice: Subject to any disclaimer, the term of this patent is extended or adjusted under 35 U.S.C. 154(b) by 49 days.

(21) Appl. No.: 17/092,899

(22) Filed: Nov. 9, 2020

(65) Prior Publication Data
US 2021/0058166 A1 Feb. 25, 2021

Related U.S. Application Data (63) Continuation of application No. PCT/CN2018/124557, filed on Dec. 28, 2018.

(30) Foreign Application Priority Data

May 8, 2018 (CN) .......................... 201810431906.7

(51) Int. Cl.
*H04B 7/06* (2006.01)
*H04B 17/12* (2015.01)
(Continued)

(52) U.S. Cl.
CPC ............... *H04B 17/12* (2015.01); *H01Q 3/36* (2013.01); *H01Q 21/08* (2013.01)

(58) Field of Classification Search
CPC ........ H04B 17/12; H04B 7/0617; H01Q 3/36; H01Q 21/08; G01R 29/0892; G01R 29/10
(Continued)

(56) References Cited

U.S. PATENT DOCUMENTS 5,003,314 A  3/1991 Berkowitz et al.
5,204,685 A  4/1993 Franchi et al.
(Continued)

FOREIGN PATENT DOCUMENTS

CN    1555108 A    12/2004
CN  101308177 A    11/2008
(Continued)

OTHER PUBLICATIONS

International Search Report for corresponding PCT/CN2018/124557 dated Apr. 2, 2019, 2 pages.
(Continued)

*Primary Examiner* — Fitwi Y Hailegiorgis
(74) *Attorney, Agent, or Firm* — Armstrong Teasdale LLP (57) ABSTRACT The present disclosure provides a beam synthesis method for measuring an array antenna. The method includes: obtaining a phase, an amplitude, and related distance values of each antenna unit, where the related distance values include a first distance value and a second distance value; calculating a phase directivity pattern of each antenna unit, and compensating the phase directivity pattern of each antenna unit based on the phase and the first distance value of each antenna unit, to obtain a phase error value of each antenna unit; and synthesizing radio frequency signals of a plurality of antenna units based on the phase, the amplitude, the second distance value, and the phase error value of each antenna unit, to obtain an antenna beam.

10 Claims, 6 Drawing Sheets (51) Int. Cl.
*H01Q 3/36* (2006.01)
*H01Q 21/08* (2006.01)

(58) Field of Classification Search
USPC .......................................................... 375/262
See application file for complete search history.

(56) References Cited

U.S. PATENT DOCUMENTS

| | | |
|---|---|---|
| 6,624,784 B1 | 9/2003 | Yamaguchi |
| 9,031,151 B1 | 5/2015 | Harris et al. |
| 2003/0117315 A1* | 6/2003 | Graham ................. G01R 29/10 |
| | | 342/174 |
| 2009/0211079 A1* | 8/2009 | Toso ....................... H01P 11/00 |
| | | 29/600 |

FOREIGN PATENT DOCUMENTS

| | | |
|---|---|---|
| CN | 102426300 A | 4/2012 |
| CN | 104852775 A | 8/2015 |
| CN | 106199220 A | 12/2016 |
| CN | 106291129 A | 1/2017 |
| CN | 106680601 A | 5/2017 |
| CN | 106872801 A | 6/2017 |
| CN | 107038299 A | 8/2017 |
| KR | 20100079734 A | 7/2010 |
| WO | 2013174351 A2 | 11/2013 |

OTHER PUBLICATIONS

Supplementary European Search Report for corresponding European App. No 18918093.8, dated Jan. 27, 2022, 9 pages.

* cited by examiner

BEAM SYNTHESIS METHOD AND APPARATUS FOR MEASURING ARRAY ANTENNA

CROSS-REFERENCE TO RELATED APPLICATIONS

The present application is a continuation of International Patent Application No. PCT/CN2018/0124557, filed on Dec. 28, 2018, which claims the benefit of priority to Chinese Patent Application No. 201810431906.7, filed on May 8, 2018, the contents of which are hereby incorporated by reference in their entirety.

TECHNICAL FIELD

The present disclosure relates to the field of antennas, and specifically, to a beam synthesis method and apparatus for measuring an array antenna.

BACKGROUND

In the related art, in an electrical performance test on an array antenna or a combination of an array antenna and a radome, an actual operating stats is usually simulated, and the test is performed with a transmitter. However, performance of the array antenna and the radome in a test condition without a transmitter cannot be learned.

For the problem in the related art, no effective solution is currently proposed.

SUMMARY

For the problem in the related art, the present disclosure provides a beam synthesis method and apparatus for measuring an array antenna, so that beam synthesis can be performed on far-field data in a single-antenna test, to implement an equivalent directivity pattern test with a transmitter and resolve a far-field directivity pattern test problem without a transmitter and a beam control system.

The technical solutions in the present disclosure are implemented as follows: According to an aspect of the present disclosure, a beam synthesis method for measuring an array antenna is provided.

The beam synthesis method for measuring an array antenna includes: obtaining a phase, an amplitude, and related distance values of each antenna unit, where the related distance values include a first distance value and a second distance value, the first distance value is information about a distance between each antenna unit and a center of a rotary table, and the second distance value is information about a distance between each antenna unit and an adjacent antenna unit; calculating a phase directivity pattern of each antenna unit, and compensating the phase directivity pattern of each antenna unit based on the phase and the first distance value of each antenna unit, to obtain a phase error value of each antenna unit; and synthesizing radio frequency signals of a plurality of antenna units based on the phase, the amplitude, the second distance value, and the phase error value of each antenna unit, to obtain an antenna beam.

According to an embodiment of the present disclosure, the calculating a phase directivity pattern of each antenna unit, and compensating the phase directivity pattern of each antenna unit based on the phase and the first distance value of each antenna unit, to obtain a phase error value of each antenna unit includes: calculating the phase directivity pattern of each antenna unit; and substituting the phase and the first distance value of each antenna unit into a phase compensation formula, to obtain the phase error value of each antenna unit, so as to compensate the phase directivity pattern of each antenna unit, where the phase compensation formula is as follows:

$$\phi'_i = \phi_i + 360 \cdot \frac{r_i}{\lambda},$$

where $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas.

According to an embodiment of the present disclosure, the synthesizing radio frequency signals of a plurality of antenna units based on the phase, the amplitude, the second distance value, and the phase error value of each antenna unit, to obtain an antenna beam includes: obtaining a deflection angle of a radio frequency signal of each antenna unit, where the deflection angle of each antenna unit is the same; and calculating the antenna beam based on the phase, the amplitude, the second distance value, and the phase error value of each antenna unit, where a calculation formula is as follows:

$$A_{total} = \sum_{i=1}^{n} A_i e^{\phi'_i + i \cdot d \cdot k \cdot sin(\theta)},$$

where $A_{total}$ is the antenna beam, $A_i$ is an amplitude of the antenna unit i, e is a natural constant, d is the second distance value, k is an electromagnetic wave propagation vector, and $\theta$ is the deflection angle.

According to an embodiment of the present disclosure, the beam synthesis method further includes: obtaining far-field directivity patterns of the plurality of antenna units; generating a far-field directivity pattern of the antenna beam based on the antenna beam, and comparing antenna signal trends in the far-field directivity patterns of the plurality of antenna units and the far-field directivity pattern of the antenna beam; and if the antenna signal trends are consistent, determining that the calculated antenna beam is correct.

According to an embodiment of the present disclosure, second distance values between any two antenna units in the antenna array are equal.

According to another aspect of the present disclosure, a beam synthesis apparatus for measuring an array antenna is provided.

The beam synthesis apparatus for measuring an array antenna includes: an obtaining module, configured to: obtain a phase, an amplitude, and related distance values of each antenna unit, where the related distance values include a first distance value and a second distance value, the first distance value is information about a distance between each antenna unit and a center of a rotary table, and the second distance value is information about a distance between each antenna unit and an adjacent antenna unit; a calculation and compensation unit, configured to: calculate a phase directivity pattern of each antenna unit, and compensate the phase directivity pattern of each antenna unit based on the phase and the first distance value of each antenna unit, to obtain a phase error value of each antenna unit; and a synthesis unit, configured to: synthesize radio frequency signals of a plurality of antenna units based on the phase, the amplitude, the second distance value, and the phase error value of each antenna unit, to obtain an antenna beam.

According to an embodiment of the present disclosure, a first calculation unit, configured to: calculate the phase directivity pattern of each antenna unit; and a compensation unit, configured to: substitute the phase and the first distance value of each antenna unit into a phase compensation formula, to obtain the phase error value of each antenna unit, so as to compensate the phase directivity pattern of each antenna unit, where the phase compensation formula is as follows:

$$\phi'_i = \phi_i + 360 \cdot \frac{r_i}{\lambda},$$

where $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas.

According to an embodiment of the present disclosure, the synthesis unit includes: a first obtaining submodule, configured to: obtain a deflection angle of a radio frequency signal of each antenna unit, where the deflection angle of each antenna unit is the same; and a second calculation unit, configured to: calculate the antenna beam based on the phase, the amplitude, the second distance value, and the phase error value of each antenna unit, where a calculation formula is as follows:

$$A_{total} = \sum_{i=1}^{n} A_i e^{\phi'_i + i \cdot d \cdot k \cdot sin(\theta)},$$

where $A_{total}$ is the antenna beam, $A_i$ is an amplitude of the antenna unit i, e is a natural constant, d is the second distance value, k is an electromagnetic wave propagation vector, and $\theta$ is the deflection angle.

According to an embodiment of the present disclosure, the beam synthesis apparatus further includes: a second obtaining submodule, configured to: obtain far-field directivity patterns of the plurality of antenna units; a comparison unit, configured to: generate a far-field directivity pattern of the antenna beam based on the antenna beam, and compare antenna signal trends in the far-field directivity patterns of the plurality of antenna units and the far-field directivity pattern of the antenna beam; and a determining unit, configured to: if the antenna signal trends are consistent, determine that the calculated antenna beam is correct.

According to an embodiment of the present disclosure, second distance values between any two antenna units in the antenna array are equal.

A beneficial effect of the present disclosure lies in:

In the present disclosure, the phase, the amplitude, and the related distance values of each antenna unit are obtained; then the phase directivity pattern of each antenna unit is calculated, and the phase directivity pattern of each antenna unit is compensated based on the phase and the first distance value of each antenna unit, to obtain the phase error value of each antenna unit; and finally, radio frequency signals of a plurality of antenna units are synthesized based on the phase, the amplitude, the second distance value, and the phase error value of each antenna unit, to obtain the antenna beam.

Therefore, beam synthesis is performed on far-field data in a single-antenna test, to implement an equivalent directivity pattern test with a transmitter.

BRIEF DESCRIPTION OF DRAWINGS

To describe the technical solutions in the embodiments of the present disclosure or in the related art more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure shall fall within the protection scope of the present disclosure.

According to an embodiment of the present disclosure, a beam synthesis method for measuring an array antenna is provided.

Figure 1:
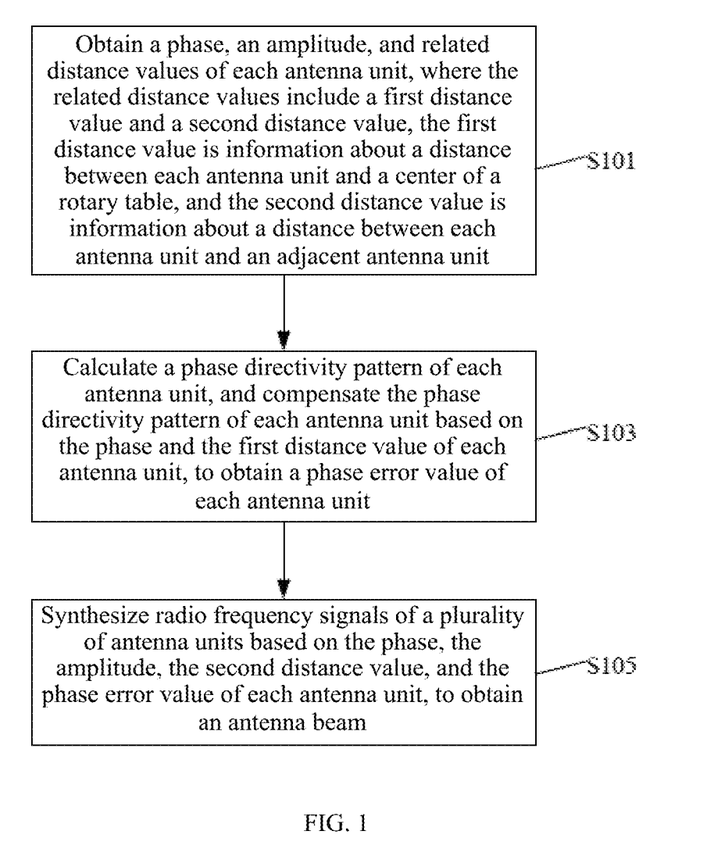
FIG. 1 is a flowchart of a beam synthesis method for measuring an array antenna according to an embodiment of the present disclosure.

As shown in FIG. 1, the beam synthesis method for measuring an array antenna according to this embodiment of the present disclosure includes the following operations S101, S103 and S105. In the operation S101, a phase, an amplitude, and related distance values of each antenna unit are obtained, where the related distance values include a first distance value and a second distance value, the first distance value is information about a distance between each antenna unit and a center of a rotary table, and the second distance value is information about a distance between each antenna unit and an adjacent antenna unit. In the operation S103, a phase directivity pattern of each antenna unit is calculated, and the phase directivity pattern of each antenna unit is compensated based on the phase and the first distance value of each antenna unit, to obtain a phase error value of each antenna unit. In the operation S105, radio frequency signals of a plurality of antenna units are synthesized based on the phase, the amplitude, the second distance value, and the phase error value of each antenna unit, to obtain an antenna beam.

According to the foregoing technical solution in the present disclosure, the phase, the amplitude, and the related distance values of each antenna unit are obtained; then the phase directivity pattern of each antenna unit is calculated, and the phase directivity pattern of each antenna unit is compensated based on the phase and the first distance value of each antenna unit, to obtain the phase error value of each antenna unit; and finally, radio frequency signals of a plurality of antenna units are synthesized based on the phase, the amplitude, the second distance value, and the phase error value of each antenna unit, to obtain the antenna beam. Therefore, beam synthesis is performed on far-field data in a single-antenna test, to implement an equivalent directivity pattern test with a transmitter.

To better understood the technical solutions in the present disclosure, the following gives detailed description by using specific embodiments.

The present disclosure discloses a beam synthesis method for measuring an array antenna. The beam synthesis method includes the following operations S1, S2 and S3.

In the operation S1, a phase, an amplitude, and related distance values of each antenna unit are obtained, where the related distance values include a first distance value and a second distance value, the first distance value is information about a distance between each antenna unit and a center of a rotary table, and the second distance value is information about a distance between each antenna unit and an adjacent antenna unit.

Figure 2:
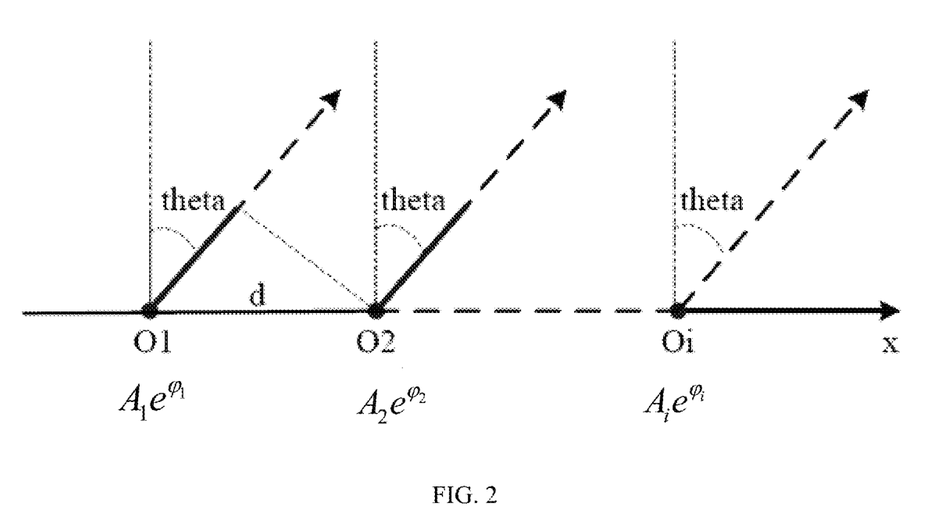
FIG. 2 is a schematic diagram of a geometrical relationship between array units according to an embodiment of the present disclosure.

In the operation S1, as shown in FIG. 2, O1, O2, . . . , and Oi indicate that a plurality of antenna units are arranged in a straight line. Certainly, it can be understood that the plurality of antenna units may be alternatively arranged according to a requirement. For example, according to an embodiment of the present disclosure, the plurality of antenna units are arranged in a circle. This is not limited in the present disclosure. In addition, deflection directions of the plurality of antenna units are consistent, and all deflection angles thereof are θ (theta). In addition, the amplitudes, the phase, and the related distance values of each of the plurality of antenna units are further obtained. The related distance values include the first distance value and the second distance value. The first distance value is the information about the distance between each antenna unit and the center of the rotary table, and the second distance value is the information about the distance between each antenna unit and an adjacent antenna unit.

In the operation S2. a phase directivity pattern of each antenna unit is calculated, and the phase directivity pattern of each antenna unit is compensated based on the phase and the first distance value of each antenna unit, to obtain a phase error value of each antenna unit.

The operation S2 includes: calculating the phase directivity pattern of each antenna unit; and substituting the phase and the first distance value of each antenna unit into a phase compensation formula, to obtain the phase error value of each antenna unit, so as to compensate the phase directivity pattern of each antenna unit, where the phase compensation formula is as follows:

$$\phi'_i = \phi_i + 360 \cdot \frac{r_i}{\lambda},$$

where $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas, so that a phase directivity pattern of the antenna is measured, and the phase directivity pattern of the antenna is compensated.

In the operation S3, radio frequency signals of a plurality of antenna units are synthesized based on the phase, the amplitude, the second distance value, and the phase error value of each antenna unit, to obtain an antenna beam.

The operation S3 includes: obtaining a deflection angle of a radio frequency signal of each antenna unit, where the deflection angle of each antenna unit is the same; and calculating the antenna beam based on the phase, the amplitude, the second distance value, and the phase error value of each antenna unit, where a calculation formula is as follows:

$$A_{total} = \sum_{i=1}^{n} A_i e^{\phi'_i + i \cdot d \cdot k \cdot \sin(\theta)},$$

where $A_{total}$ is the antenna beam, $A_i$ is an amplitude of the antenna unit i, e is a natural constant, d is the second distance value, k is an electromagnetic wave propagation vector, and θ is the deflection angle, so that a plurality of signals are synthesized to obtain a synthetic phase directivity pattern, and calculation is performed based on the foregoing calculation formula.

In addition, when a plurality of antenna units in the array antenna are consistent, a phase directivity pattern of one of the antenna units (or a single antenna) may be compensated, without a need of performing operations on all the antenna units, thereby greatly saving time. That the plurality of antenna units are consistent means that specifications, sizes, and the like of the plurality of antenna units are consistent.

According to an embodiment of the present disclosure, the beam synthesis method further includes: obtaining far-field directivity patterns of the plurality of antenna units; generating a far-field directivity pattern of the antenna beam based on the antenna beam, and comparing antenna signal trends in the far-field directivity patterns of the plurality of antenna units and the far-field directivity pattern of the antenna beam; and if the antenna signal trends are consistent, determining that the calculated antenna beam is correct.

Figure 3:
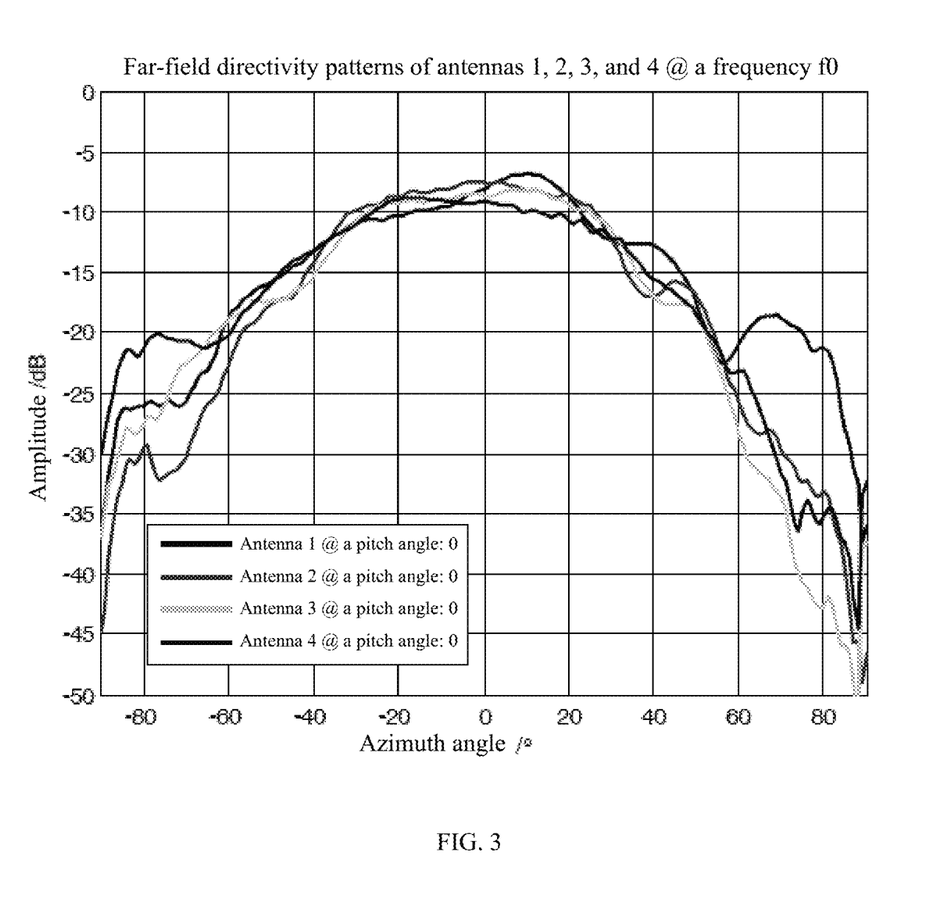
FIG. 3 is an antenna directivity pattern according to an embodiment of the present disclosure.
Figure 4:
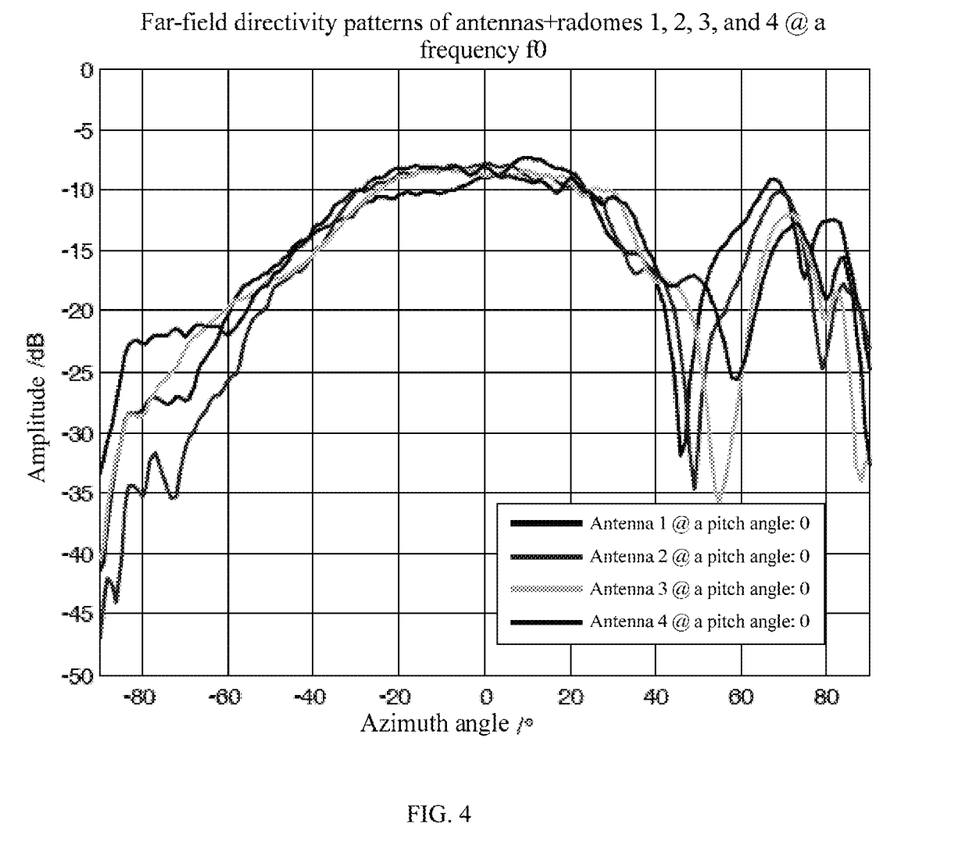
FIG. 4 is an antenna directivity pattern of a combination of an antenna and a radome according to an embodiment of the present disclosure.
Figure 5:
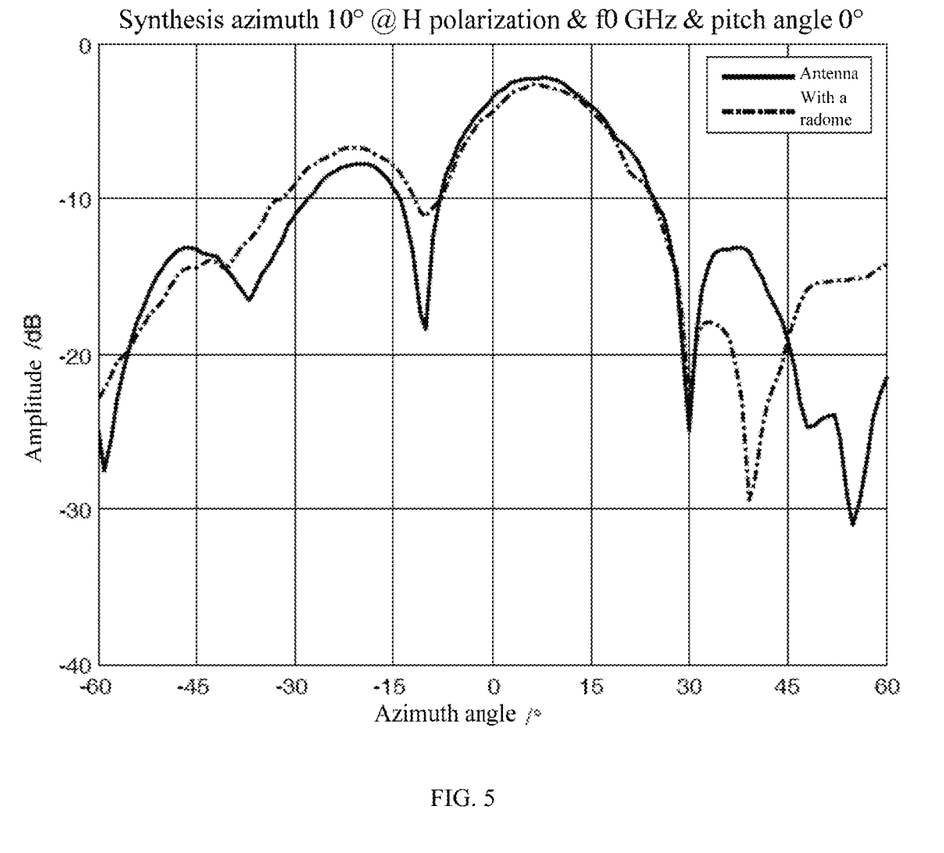
FIG. 5 is an antenna directivity pattern of a synthetic beam according to an embodiment of the present disclosure.

In this embodiment, further refer to FIG. 3, which shows a directivity pattern of four antenna units; further refer to FIG. 4, which shows a directivity pattern of a combination of an antenna unit and a radome; and further refer to FIG. 5, which shows a directivity pattern of a four-channel synthetic beam, where a maximum level of the synthetic beam is raised, a main-lobe offset is approximately 10°, and multi-state side lobes appear, so that a beam synthesis algorithm is verified.

According to an embodiment of the present disclosure, second distance values between any two antenna units in the antenna array are equal. In addition, it can be certainly understood that a person skilled in the art may alternatively set a distance between two antenna units according to an actual requirement. This is not limited in the present disclosure.

In addition, the beam synthesis method for measuring an array antenna may be further applied to fields such as aerospace and civilian use, to equivalently learn a synthetic directivity pattern of an array antenna and an electrical performance status of a radome under a synthetic beam.

According to an embodiment of the present disclosure, a beam synthesis apparatus for measuring an array antenna is further provided.

Figure 6:
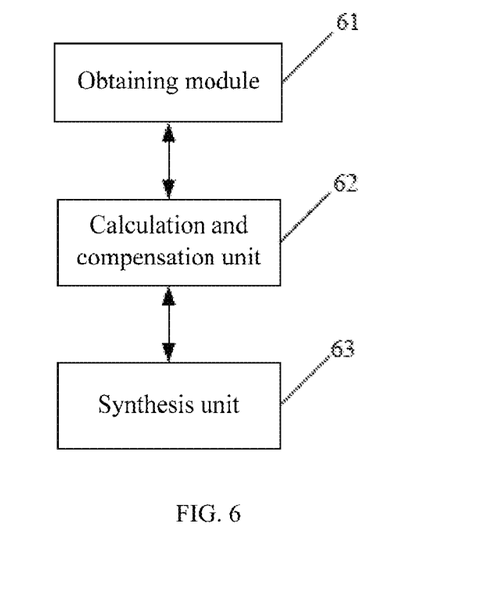
FIG. 6 is a block diagram of a beam synthesis apparatus for measuring an array antenna according to an embodiment of the present disclosure.

As shown in FIG. 6, the beam synthesis apparatus for measuring an array antenna according to this embodiment of the present disclosure includes: an obtaining module 61, configured to: obtain a phase, an amplitude, and related distance values of each antenna unit, where the related distance values include a first distance value and a second distance value, the first distance value is information about a distance between each antenna unit and a center of a rotary table, and the second distance value is information about a distance between each antenna unit and an adjacent antenna unit; a calculation and compensation unit 62, configured to: calculate a phase directivity pattern of each antenna unit, and compensate the phase directivity pattern of each antenna unit based on the phase and the first distance value of each antenna unit, to obtain a phase error value of each antenna unit; and a synthesis unit 63, configured to: synthesize radio frequency signals of a plurality of antenna units based on the phase, the amplitude, the second distance value, and the phase error value of each antenna unit, to obtain an antenna beam.

According to an embodiment of the present disclosure, the calculation and compensation unit 62 includes: a first calculation unit (not shown), configured to: calculate the phase directivity pattern of each antenna unit; and a compensation unit (not shown), configured to: substitute the phase and the first distance value of each antenna unit into a phase compensation formula, to obtain the phase error value of each antenna unit, so as to compensate the phase directivity pattern of each antenna unit, where the phase compensation formula is as follows:

$$\phi'_i = \phi_i + 360 \cdot \frac{r_i}{\lambda},$$

where $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas.

According to an embodiment of the present disclosure, the synthesis unit 63 includes: a first obtaining submodule (not shown), configured to: obtain a deflection angle of a radio frequency signal of each antenna unit, where the deflection angle of each antenna unit is the same; and a second calculation unit (not shown), configured to: calculate the antenna beam based on the phase, the amplitude, the second distance value, and the phase error value of each antenna unit, where a calculation formula is as follows:

$$A_{total} = \sum_{i=1}^{n} A_i e^{\phi'_i + i \cdot d \cdot k \cdot sin(\theta)},$$

where $A_{total}$ is the antenna beam, $A_i$ is an amplitude of the antenna unit i, e is a natural constant, d is the second distance value, k is an electromagnetic wave propagation vector, and $\theta$ is the deflection angle.

According to an embodiment of the present disclosure, the beam synthesis apparatus further includes: a second obtaining submodule (not shown), configured to: obtain far-field directivity patterns of the plurality of antenna units; a comparison unit (not shown), configured to: generate a far-field directivity pattern of the antenna beam based on the antenna beam, and compare antenna signal trends in the far-field directivity patterns of the plurality of antenna units and the far-field directivity pattern of the antenna beam; and a determining unit (not shown), configured to: if the antenna signal trends are consistent, determine that the calculated antenna beam is correct.

According to an embodiment of the present disclosure, second distance values between any two antenna units in the antenna array are equal.

To sum up, according to the foregoing technical solutions in the present disclosure, the phase, the amplitude, and the related distance values of each antenna unit are obtained; then the phase directivity pattern of each antenna unit is calculated, and the phase directivity pattern of each antenna unit is compensated based on the phase and the first distance value of each antenna unit, to obtain the phase error value of each antenna unit; and finally, radio frequency signals of a plurality of antenna units are synthesized based on the phase, the amplitude, the second distance value, and the phase error value of each antenna unit, to obtain the antenna beam. Therefore, beam synthesis is performed on far-field data in a single-antenna test, to implement an equivalent directivity pattern test with a transmitter.

The foregoing are merely preferred embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A beam synthesis method for measuring an array antenna, wherein the array antenna comprises a plurality of antenna units, and the method comprises:

obtaining a phase, an amplitude, and related distance values of each antenna unit, wherein the related distance values comprise a first distance value and a second distance value, the first distance value is information about a distance between each antenna unit and a center of a rotary table, and the second distance value is information about a distance between each antenna unit and an adjacent antenna unit;

calculating a phase directivity pattern of each antenna unit, and compensating the phase directivity pattern of each antenna unit based on the phase and the first distance value of each antenna unit, to obtain a phase error value of each antenna unit; and synthesizing radio frequency signals of a plurality of antenna units based on the phase, the amplitude, the second distance value, and the phase error value of each antenna unit, to obtain an antenna beam.

2. The beam synthesis method according to claim 1, wherein the calculating a phase directivity pattern of each antenna unit, and compensating the phase directivity pattern of each antenna unit based on the phase and the first distance value of each antenna unit, to obtain a phase error value of each antenna unit comprises:

calculating the phase directivity pattern of each antenna unit; and substituting the phase and the first distance value of each antenna unit into a phase compensation formula, to obtain the phase error value of each antenna unit, so as to compensate the phase directivity pattern of each antenna unit, wherein the phase compensation formula is as follows:

$$\phi'_i = \phi_i + 360 \cdot \frac{r_i}{\lambda},$$

wherein $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas.

3. The beam synthesis method according to claim 2, wherein the synthesizing radio frequency signals of a plurality of antenna units based on the phase, the amplitude, the second distance value, and the phase error value of each antenna unit, to obtain an antenna beam comprises:
obtaining a deflection angle of a radio frequency signal of each antenna unit, wherein the deflection angle of each antenna unit is the same; and
calculating the antenna beam based on the phase, the amplitude, the second distance value, and the phase error value of each antenna unit, wherein a calculation formula is as follows:

$$A_{total} = \sum_{i=1}^{n} A_i e^{\phi'_i + i \cdot d \cdot k \cdot \sin(\theta)},$$

wherein $A_{total}$ is the antenna beam, $A_i$ is an amplitude of the antenna unit i, e is a natural constant, d is the second distance value, k is an electromagnetic wave propagation vector, and $\theta$ is the deflection angle.

4. The beam synthesis method according to claim 3, wherein the beam synthesis method further comprises:
obtaining far-field directivity patterns of the plurality of antenna units;
generating a far-field directivity pattern of the antenna beam based on the antenna beam, and comparing antenna signal trends in the far-field directivity patterns of the plurality of antenna units and the far-field directivity pattern of the antenna beam; and
if the antenna signal trends are consistent, determining that the calculated antenna beam is correct.

5. The beam synthesis method according to claim 1, wherein second distance values between any two antenna units in the antenna array are equal.

6. A beam synthesis apparatus for measuring an array antenna, wherein the array antenna comprises a plurality of antenna units and a processor, wherein the processor is configured to:
obtain a phase, an amplitude, and related distance values of each antenna unit, wherein the related distance values comprise a first distance value and a second distance value, the first distance value is information about a distance between each antenna unit and a center of a rotary table, and the second distance value is information about a distance between each antenna unit and an adjacent antenna unit;
calculate a phase directivity pattern of each antenna unit, and compensate the phase directivity pattern of each antenna unit based on the phase and the first distance value of each antenna unit, to obtain a phase error value of each antenna unit; and
synthesize radio frequency signals of a plurality of antenna units based on the phase, the amplitude, the second distance value, and the phase error value of each antenna unit, to obtain an antenna beam.

7. The beam synthesis apparatus according to claim 6, wherein the processor is configured to:
calculate the phase directivity pattern of each antenna unit; and
substitute the phase and the first distance value of each antenna unit into a phase compensation formula, to obtain the phase error value of each antenna unit, so as to compensate the phase directivity pattern of each antenna unit, wherein the phase compensation formula is as follows:

$$\phi'_i = \phi_i + 360 \cdot \frac{r_i}{\lambda},$$

wherein $\phi'_i$ is a phase error value of an antenna unit i, $\phi_i$ is a phase of the antenna unit i, $r_i$ is a first distance value of the antenna unit i, $\lambda$ is a wavelength of an electromagnetic wave transmitted by the array antenna, i is a natural number greater than 1 and less than n, and n is a quantity of antennas.

8. The beam synthesis apparatus according to claim 7, wherein the processor is configured to:
obtain a deflection angle of a radio frequency signal of each antenna unit, wherein the deflection angle of each antenna unit is the same; and
calculate the antenna beam based on the phase, the amplitude, the second distance value, and the phase error value of each antenna unit, wherein a calculation formula is as follows:

$$A_{total} = \sum_{i=1}^{n} A_i e^{\phi'_i + i \cdot d \cdot k \cdot \sin(\theta)},$$

wherein $A_{total}$ is the antenna beam, $A_i$ is an amplitude of the antenna unit i, e is a natural constant, d is the second distance value, k is an electromagnetic wave propagation vector, and $\theta$ is the deflection angle.

9. The beam synthesis apparatus according to claim 8, wherein the processor is further configured to:
obtain far-field directivity patterns of the plurality of antenna units;
generate a far-field directivity pattern of the antenna beam based on the antenna beam, and compare antenna signal trends in the far-field directivity patterns of the plurality of antenna units and the far-field directivity pattern of the antenna beam; and
if the antenna signal trends are consistent, determine that the calculated antenna beam is correct.

10. The beam synthesis apparatus according to claim 6, wherein second distance values between any two antenna units in the antenna array are equal.

* * * * *